(12) United States Patent  
Curtis (10) Patent No.: US 8,458,637 B2  
(45) Date of Patent: Jun. 4, 2013

(54) IMPLEMENTING ENHANCED RLM CONNECTIVITY ON A HIERARCHICAL DESIGN WITH TOP LEVEL PIPELINE REGISTERS

(75) Inventor: Paul G. Curtis, Fort Collins, CO (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/910,127

(22) Filed: Oct. 22, 2010

(65) Prior Publication Data

US 2012/0102445 A1    Apr. 26, 2012

(51) Int. Cl.
*G06F 17/50*    (2006.01)

(52) U.S. Cl.
USPC ........................................................ 716/119

(58) Field of Classification Search
USPC ........................................................ 716/119
See application file for complete search history.

(56) References Cited

U.S. PATENT DOCUMENTS

| | | | | |
|---|---|---|---|---|
| 6,928,630 | B2 * | 8/2005 | Moon et al. | 716/134 |
| 7,464,361 | B2 * | 12/2008 | Sandbote | 716/104 |
| 7,640,519 | B2 * | 12/2009 | Oktem et al. | 716/116 |
| 7,676,768 | B1 * | 3/2010 | Bourgeault et al. | 716/126 |

* cited by examiner

*Primary Examiner* — Jack Chiang
*Assistant Examiner* — Brandon Bowers
(74) *Attorney, Agent, or Firm* — Joan Pennington (57) ABSTRACT

A method, system, and computer program product are provided for implementing enhanced random logic macro (RLM) connectivity on a hierarchical design on an integrated circuit chip with top-level pipeline registers. Random logic macros (RLMs) to be connected are identified. Pipeline registers are identified; an input net is connected to an output net of the identified RLMs, removing the pipeline registers from the design. A chip floor plan results is displayed, providing direct RLM connectivity.

14 Claims, 8 Drawing Sheets

IMPLEMENTING ENHANCED RLM CONNECTIVITY ON A HIERARCHICAL DESIGN WITH TOP LEVEL PIPELINE REGISTERS

FIELD OF THE INVENTION

The present invention relates generally to the data processing field, and more particularly, relates to a method, system and computer program product for implementing enhanced random logic macro (RLM) connectivity on a hierarchical design on an integrated circuit chip with top level pipeline registers.

DESCRIPTION OF THE RELATED ART

Top-level pipeline registers often are added to a design in order break up long RLM-to-RLM timing paths in a hierarchical design. These pipeline registers make RLM-to-RLM connectivity analysis difficult when the chip floor plan is being developed.

It is critical to analyze RLM-to-RLM connectivity when creating or changing a chip floor plan. The presence of pipeline registers between RLMs prevents the designer from seeing the true physical path and connectivity from one RLM to another.

Placement of the pipeline registers cannot be performed until the RLM placements are complete. It is common for known floor planning tools to temporarily assign unplaced gates, such the pipeline registers, in the lower left corner of the floor plan.

A need exists for an efficient and effective mechanism to implement enhanced random logic macro (RLM) connectivity on a hierarchical design on an integrated circuit chip.

SUMMARY OF THE INVENTION

A principal aspect of the present invention is to provide a method, system and computer program product for implementing enhanced random logic macro (RLM) connectivity on a hierarchical design on an integrated circuit chip with top level pipeline registers. Other important aspects of the present invention are to provide such method, system, and computer program product substantially without negative effects and that overcome many of the disadvantages of prior art arrangements.

In brief, a method, system and computer program product are provided for implementing enhanced random logic macro (RLM) connectivity on a hierarchical design on an integrated circuit chip with top-level pipeline registers. Random logic macros (RLMs) to be connected are identified. Pipeline registers are identified; an input net is connected to an output net of the identified RLMs, removing the pipeline registers from the design.

In accordance with features of the invention, a chip floor plan results is displayed, providing direct RLM connectivity.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a system, method and computer program product are provided to generate an integrated circuit floor plan results display with pipeline registers removed in accordance with the preferred embodiment. The integrated circuit floor plan results display illustrates direct connectivity between random logic macros (RLMs), enabling a designer to create an enhanced chip floor plan.

Figure 1:
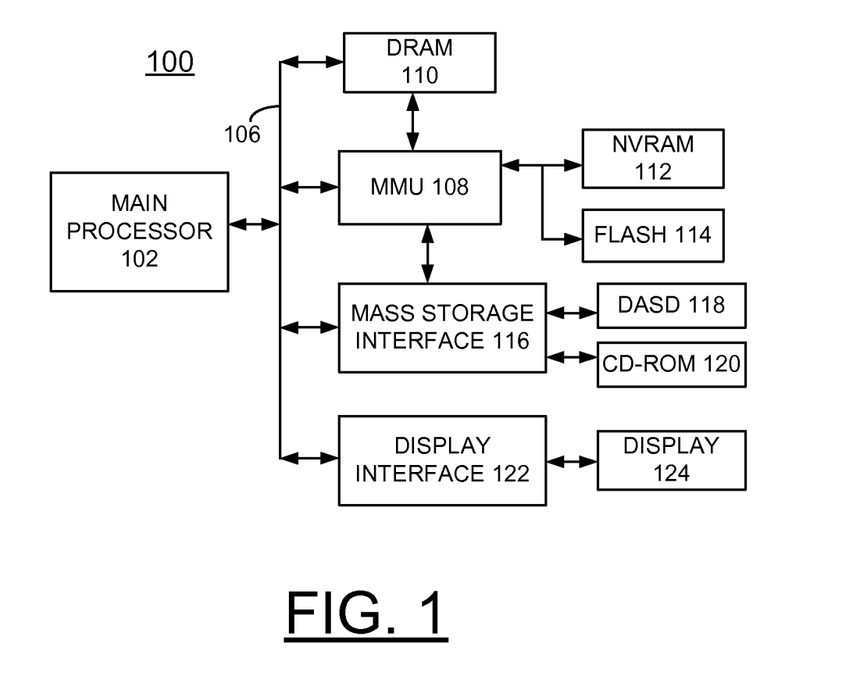
FIGS. 1 and 2 are block diagram representations illustrating an example computer system and operating system for implementing enhanced random logic macro (RLM) connectivity on a hierarchical design on an integrated circuit chip with top level pipeline registers in accordance with the preferred embodiment.
Figure 2:
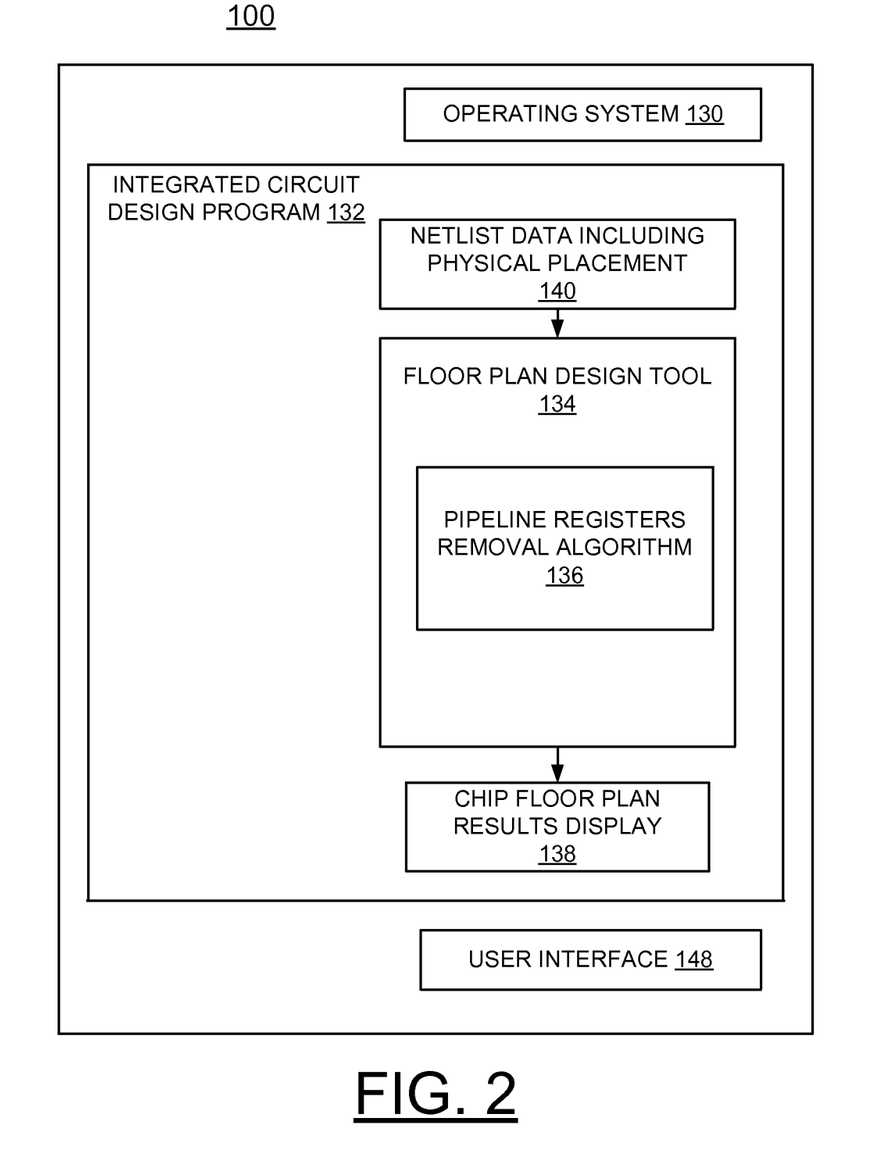

Referring now to the drawings, in FIGS. 1 and 2 there is shown a computer system generally designated by the reference character 100 for implementing enhanced random logic macro (RLM) connectivity on a hierarchical design on an integrated circuit chip with top level pipeline registers in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an integrated circuit design program 132, a floor plan design tool 134, a pipeline registers removal algorithm or program 136 of the preferred embodiment, a chip floor plan results display 138 of the preferred embodiment, netlist data including physical placement 140 describing physical placement of the random logic macros (RLMs) to be connected, and a user interface 142.

Various commercially available computers can be used for computer system 100. CPU 102 is suitably programmed by the pipeline registers removal algorithm or program 136 to execute the flowchart of FIG. 8 for implementing enhanced random logic macro (RLM) connectivity on a hierarchical design on an integrated circuit chip with top level pipeline registers in accordance with the preferred embodiment.

Figure 3:
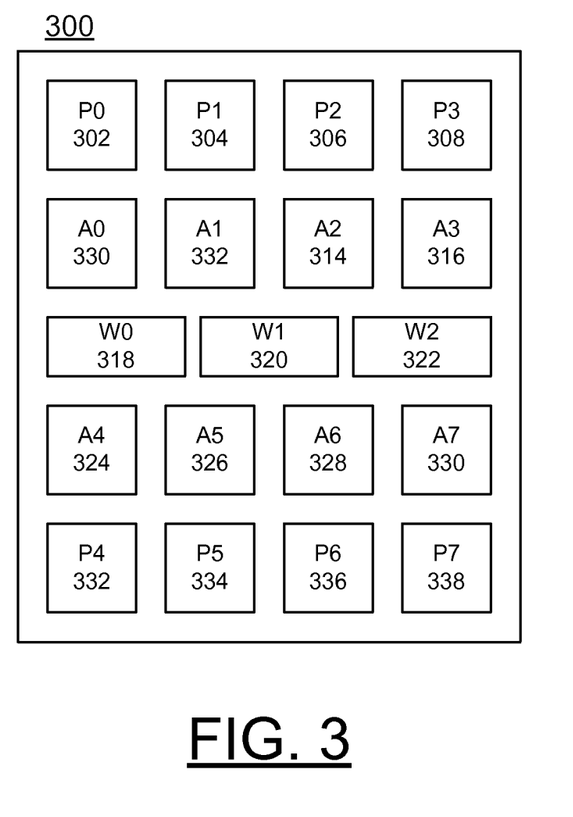
FIG. 3 is an example integrated circuit of a type to be used for implementing enhanced random logic macro (RLM) connectivity on a hierarchical design on an integrated circuit chip with top level pipeline registers in accordance with the preferred embodiment.

Referring to FIG. 3, there is shown an example integrated circuit of a type to be used for implementing enhanced random logic macro (RLM) connectivity on a hierarchical design on an integrated circuit chip with top level pipeline registers generally designated by the reference character 300 in accordance with the preferred embodiment. The integrated circuit 300 includes a plurality of random logic macros (RLMs) P0-P3, 302, 304, 306, 308; A0-A3, 310, 312, 314, 316; W0-W2, 318, 320, 322; A4-A7, 324, 326, 328, 330; and P4-P7, 332, 334, 336, 338.

Figure 4:
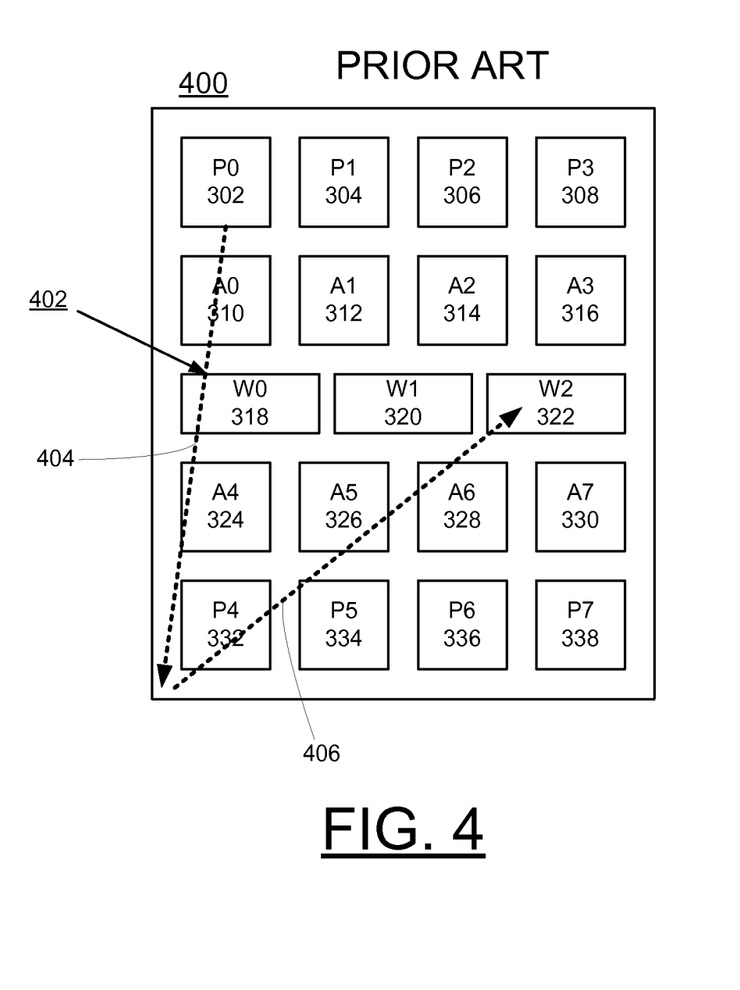
FIG. 4 is a prior art integrated circuit floor plan with pipeline registers in the design.

Referring to FIG. 4, there is shown a prior art integrated circuit floor plan generally designated by the reference character 400 with pipeline registers in the design. The illustrated integrated circuit floor plan 400 shows the integrated circuit 300 with physical path connectivity 402 between the RLMs P0, 302 and W0 322 indicated by a pair of dotted lines with arrows 404, 406. It is common for floor planning tools to temporarily assign unplaced gates; such the pipeline registers in the lower left corner of the floor plan. In the illustrated floor plan 400, the physical path connectivity 402 between the RLMs P0, 302 and W0 322, goes through the lower left corner of the floor plan for connection to pipeline registers. The presence of pipeline registers makes RLM-to-RLM connectivity analysis difficult when the chip floor plan is being developed, such as in the illustrated integrated circuit floor plan 400.

Figure 5:
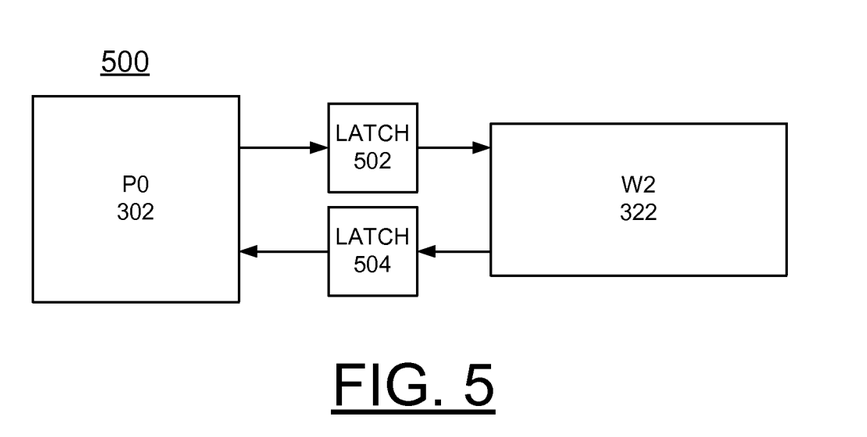
FIGS. 5 and 6 illustrate exemplary sequential steps for implementing enhanced random logic macro (RLM) connectivity on a hierarchical design on an integrated circuit chip with top level pipeline registers in accordance with the preferred embodiment.
Figure 6:
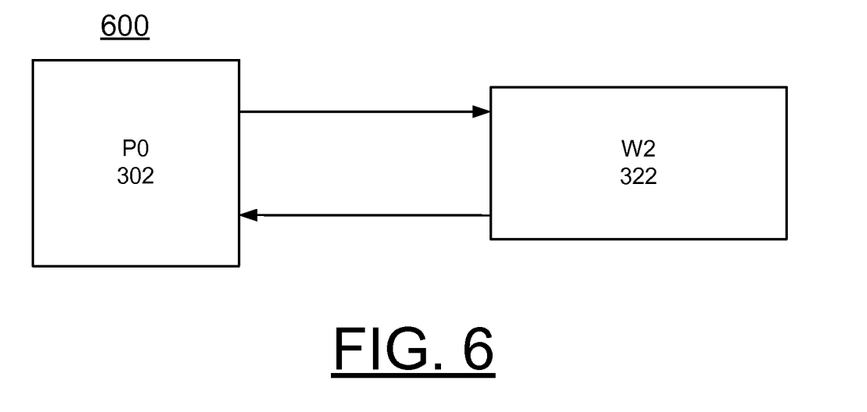

Referring to FIGS. 5 and 6, exemplary sequential steps generally designated by the reference characters 500 and 600 are shown in accordance with the preferred embodiment for implementing enhanced random logic macro (RLM) connectivity on a hierarchical design on an integrated circuit chip 300 with top level pipeline registers.

In FIG. 5, the illustrated floor-planning step 500 includes a pair of top-level pipeline registers or pipeline latches 502, 504 connect the RLMs P0, 302 and W0 322.

In FIG. 6, the illustrated floor-planning step 600 the pair of top-level pipeline registers or pipeline latches 502, 504 have been removed and the RLMs P0, 302 and W0 322 are directly connected.

Figure 7:
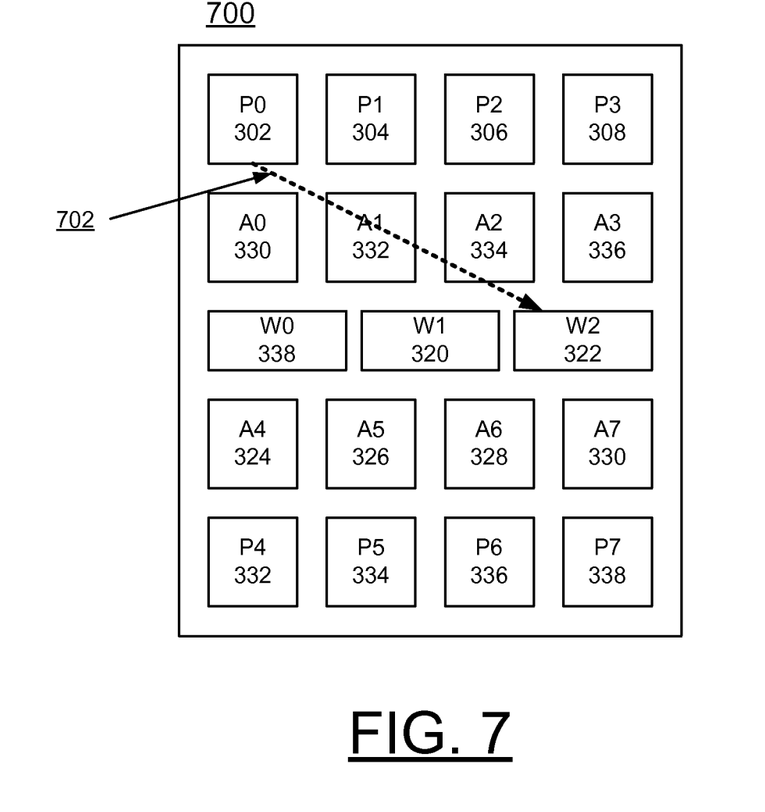
FIG. 7 is an integrated circuit floor plan results display with pipeline registers removed in accordance with the preferred embodiment.

Referring now to FIG. 7, there is shown an integrated circuit floor plan results display with pipeline registers removed generally designated by the reference character 700 in accordance with the preferred embodiment. The integrated circuit floor plan results display 700 includes a direct path 702 indicated by a single dotted line with an arrow.

Figure 8:
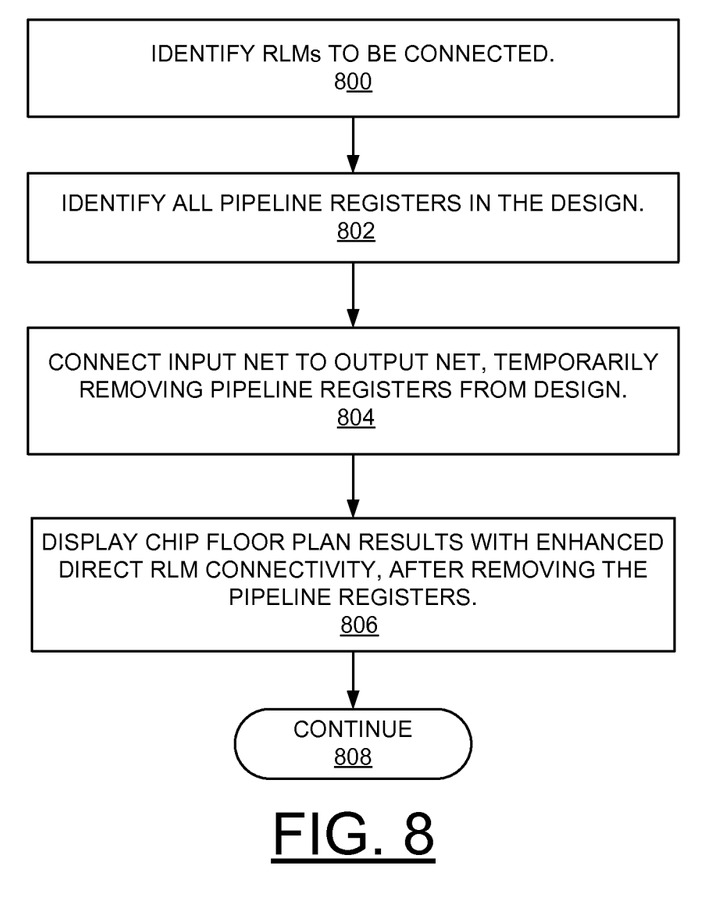
FIG. 8 is a flow chart illustrating exemplary sequential steps for implementing enhanced random logic macro (RLM) connectivity on a hierarchical design on an integrated circuit chip with top level pipeline registers in accordance with the preferred embodiment.

FIG. 8 is a flow chart illustrating exemplary sequential steps for implementing enhanced random logic macro (RLM) connectivity on a hierarchical design on an integrated circuit chip with top-level pipeline registers in accordance with the preferred embodiment. Random logic macros (RLMs) to be connected are identified as indicated at a block 800. Pipeline registers are identified as indicated at a block 802. As indicated at a block 804, an input net is connected to an output net of the identified RLMs, removing the pipeline registers from the design.

In accordance with features of the invention, a chip floor plan results is displayed, providing enhanced direct RLM connectivity as indicated at a block 806. With the pipeline registers in the design, the designer sees a floor plan when analyzing connectivity, such as floor plan 400 shown in FIG. 4. The designer cannot effectively create a quality chip floor plan without seeing the true RLM-to-RLM connectivity. By providing enhanced direct RLM connectivity such as floor plan 700 shown in FIG. 7 since the pipeline registers no longer exist between the RLMs, the designer can then see the real RLM connectivity and create a quality chip floor plan. The method of the invention, temporarily removes the pipeline registers from the design while preserving RLM connectivity, enabling more effective RLM-to-RLM connectivity analysis. The operations continue as indicated at a block 808.

Figure 9:
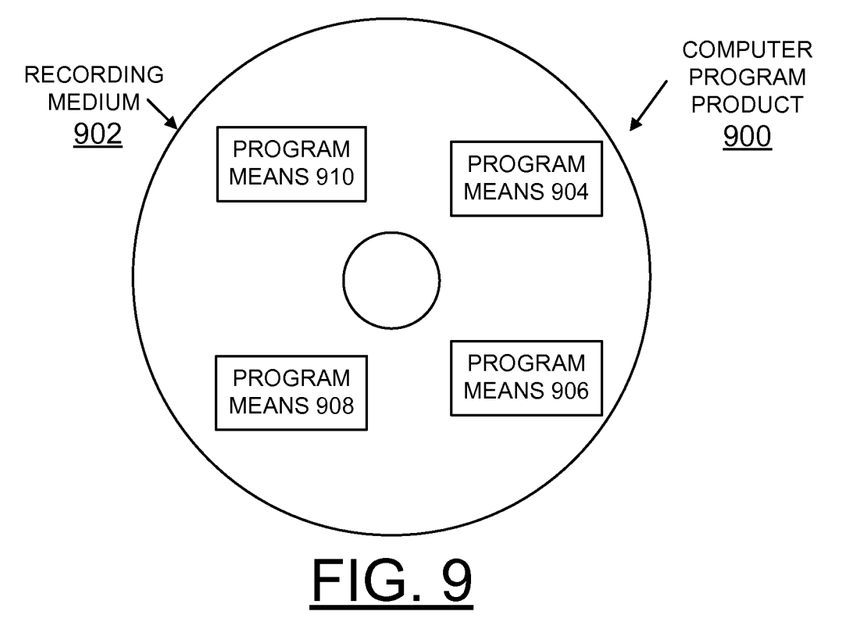
FIG. 9 is a block diagram illustrating a computer program product in accordance with the preferred embodiment.

Referring now to FIG. 9, an article of manufacture or a computer program product 900 of the invention is illustrated. The computer program product 900 includes a recording medium 902, such as, a floppy disk, a high capacity read only memory in the form of an optically read compact disk or CD-ROM, a tape, or another similar computer program product. Recording medium 902 stores program means 904, 906, 908, 910 on the medium 902 for carrying out the methods for implementing enhanced random logic macro (RLM) connectivity on a hierarchical design on an integrated circuit chip with top level pipeline registers of the preferred embodiment in the system 100 of FIGS. 1 and 2.

A sequence of program instructions or a logical assembly of one or more interrelated modules defined by the recorded program means 904, 906, 908, 910, direct the computer system 100 for implementing enhanced random logic macro (RLM) connectivity on a hierarchical design on an integrated circuit chip with top level pipeline registers of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing random logic macro (RLM) connectivity on a hierarchical design on an integrated circuit chip with top level pipeline registers performed by a computer, said computer-implemented method comprising:
the computer identifying random logic macros (RLMs) to be connected;
the computer identifying pipeline registers,
the computer connecting an input net to an output net of the identified RLMs, and
the computer removing the pipeline registers from the design.

2. The computer-implemented method as recited in claim 1 includes displaying a chip floor plan results, providing direct RLM connectivity.

3. The computer-implemented method as recited in claim 2 wherein displaying the chip floor plan results is responsive to removing the pipeline registers from the design.

4. The computer-implemented method as recited in claim 1 wherein removing the pipeline registers from the design includes temporarily removing the pipeline registers from the design while preserving RLM connectivity.

5. A system for implementing random logic macro (RLM) connectivity on a hierarchical design on an integrated circuit chip with top level pipeline registers comprising:
    a processor,
    an integrated circuit design program tangibly embodied in a machine readable medium used in the integrated circuit design process, said integrated circuit design program including a floor plan design tool and a pipeline registers removal algorithm, and
    said processor using said floor plan design tool, identifying random logic macros (RLMs) to be connected;
    said processor using said pipeline registers removal algorithm, identifying pipeline registers; and said processor connecting an input net to an output net of the identified RLMs, and said processor removing the pipeline registers from the design.

6. The system as recited in claim 5 includes a chip floor plan results display, wherein said processor displays a chip floor plan results, providing direct RLM connectivity.

7. The system as recited in claim 5 includes a chip floor plan results display, wherein said processor displays a chip floor plan results responsive to removing the pipeline registers from the design.

8. The system as recited in claim 5 wherein said processor removing the pipeline registers from the design includes temporarily removing the pipeline registers from the design while preserving RLM connectivity.

9. The system as recited in claim 5 includes netlist data, which describes physical placement of the random logic macros (RLMs) to be connected.

10. An integrated circuit design computer program product for implementing random logic macro (RLM) connectivity on a hierarchical design on an integrated circuit chip with top level pipeline registers in a computer system, said computer program product tangibly embodied in a machine readable medium used in the integrated circuit design process, said integrated circuit design computer program product including a floor plan design tool and a pipeline registers removal algorithm, said integrated circuit design computer program product including instructions executed by the computer system to cause the computer system to perform the steps of:
    identifying random logic macros (RLMs) to be connected;
    identifying pipeline registers,
    connecting an input net to an output net of the identified RLMs, and
    removing the pipeline registers from the design.

11. The integrated circuit design computer program product as recited in claim 10 includes displaying a chip floor plan results, providing direct RLM connectivity.

12. The integrated circuit design computer program product as recited in claim 11 wherein displaying the chip floor plan results is responsive to removing the pipeline registers from the design.

13. The integrated circuit design computer program product as recited in claim 10 wherein removing the pipeline registers from the design includes temporarily removing the pipeline registers from the design while preserving RLM connectivity.

14. The integrated circuit design computer program product as recited in claim 10 wherein identifying random logic macros (RLMs) to be connected includes storing netlist data, said stored netlist data describing physical placement of the random logic macros (RLMs) to be connected.

\* \* \* \* \*